United States Patent

[11] 3,602,782

[72] Inventor Thomas Klein
3776 Redwood Circle, Palo Alto, Calif. 94306

[21] Appl. No. 882,753
[22] Filed Dec. 5, 1969
[45] Patented Aug. 31, 1971
Continuation-in-part of application Ser. No. 696,908, Jan. 10, 1968.

[54] CONDUCTOR-INSULATOR-SEMICONDUCTOR FIELD-EFFECT TRANSISTOR WITH SEMICONDUCTOR LAYER EMBEDDED IN DIELECTRIC UNDERNEATH INTERCONNECTION LAYER
2 Claims, 1 Drawing Fig.

[52] U.S. Cl. .......... 317/235 R, 317/235 AH, 317/235 AT, 317/234 M, 317/234 N
[51] Int. Cl. .......... H01l 11/14
[50] Field of Search .......... 317/235 R, 235 AH, 235 AT, 234 M, 234 N

[56] References Cited

UNITED STATES PATENTS

| | | | |
|---|---|---|---|
| 3,518,494 | 6/1970 | James | 317/101 |
| 3,373,323 | 3/1968 | Wolfrum | 317/235 |
| 3,189,973 | 6/1965 | Edwards | 29/25.3 |

*Primary Examiner*—John W. Huckert
*Assistant Examiner*—Martin H. Edlow
*Attorneys*—Roger S. Borovoy and Alan H. Macpherson

ABSTRACT: A conductor-insulator-semiconductor field-effect transistor has semiconductor layers embedded in the dielectric underneath the interconnection layers in order to prevent unwanted parasitic inversion layers, due to voltages and currents in the interconnection layers, from causing deterioration in device operation.

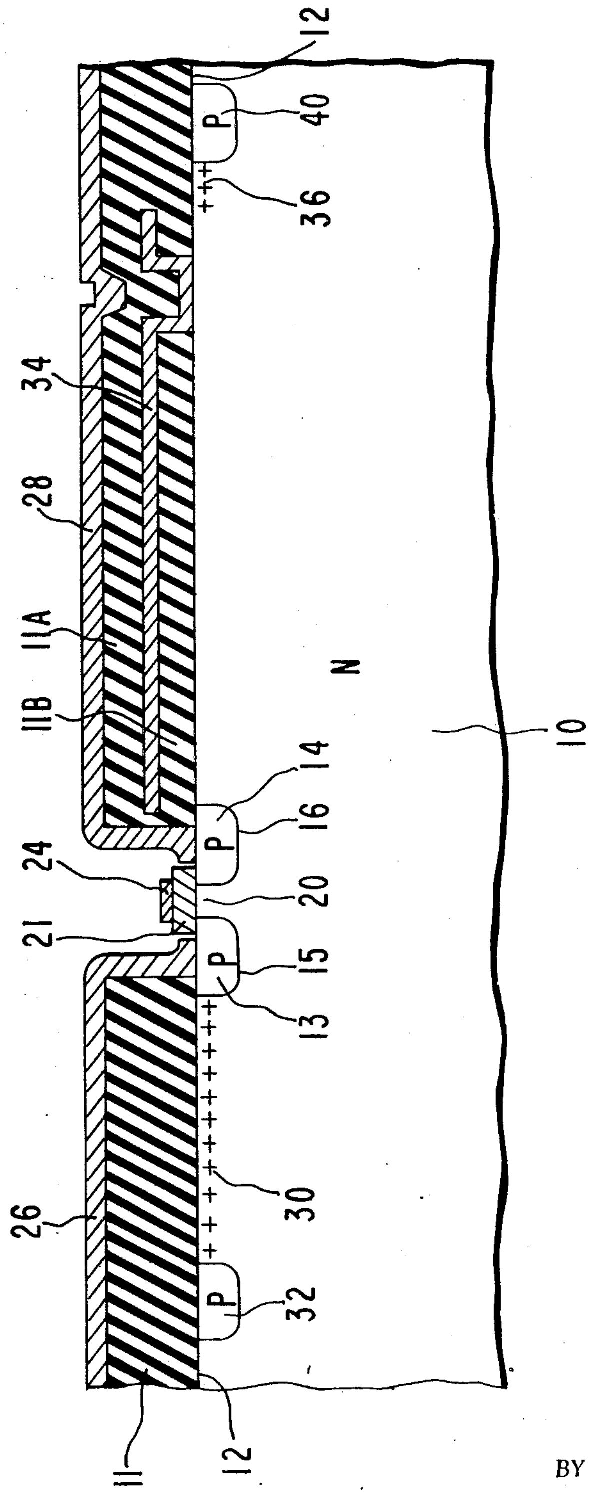
INVENTOR.
THOMAS KLEIN
BY
ATTORNEY

CONDUCTOR-INSULATOR-SEMICONDUCTOR FIELD-EFFECT TRANSISTOR WITH SEMICONDUCTOR LAYER EMBEDDED IN DIELECTRIC UNDERNEATH INTERCONNECTION LAYER

This is a continuation-in-part of U.S. Pat. application Ser. No. 696,908 filed Jan. 10, 1968.

BACKGROUND OF THE INVENTION

1. Field of the Invention

This invention relates to a structure for a conductor-insulator-semiconductor field-effect transistor, and in particular, to a structure for preventing voltages and currents in the interconnection layers of such transistors from interfering with device operation.

2. Description of the Prior Art

Electrical interconnections in a conductor-insulator-semiconductor field-effect transistor, commonly referred to as MOS FET (or MIS FET), are usually made by selectively placing evaporated metallic material over a portion of a protective insulating layer, which in turn covers portions of the substrate surface of the device. During operation, voltages and currents are thus conducted within these interconnection layers between active regions of the MOS FET devices. The voltages and currents so appearing cause electrical fields and charges to build up, in, on, and about the surface of the substrate and the overlying protective layer which, in turn, give rise to unwanted parasitic conduction paths along and near the device surface. If the parasitic conduction paths are able to extend from one active region to another, unwanted shorts and even catastrophic failure results.

In one prior art MOS FET structure, in order to prevent the spread of unwanted inversion, special regions are formed (usually by diffusion) at selected locations within the substrate in order to interrupt the inversion paths. These regions are known as channel stops, and are of the same conductivity type as the substrate but with a higher surface concentration. Although satisfactory for some applications, the channel-stop regions take up a relatively large portion of the available surface area, even as much as 50 percent. For high-density integrated circuits or complex arrays in which many MOS FET's are fabricated together in a small area on the same substrate, however, the channel-stop solution is unsatisfactory.

Because parasitic inversion of the substrate surface is inversely proportional to insulating layer thickness, unwanted parasitic inversion can also be reduced by increasing the thickness of the insulating layer. However, thick insulating layers are often undesirable. For ease of processing, the protective overlayer thicknesses should be around 1 micron. Moreover, it is often impractical to increase the protective layer thickness proportionally in order to compensate for increased inversion effects. Also, extra thick protective layers may develop contamination problems, such as occur from sodium ions, causing the electrical characteristics of the device to drift over a period of time.

Inversion layer formation is also prevented by increasing the fixed semiconductor-insulator interface charge, $Q_{ss}$. Unfortunately, however, this approach also increases the turn-on voltage of the MOS FET, an undesirable result.

A means of controlling unwanted inversion along the substrate surface of an MOS FET device is therefore needed that does not reduce available surface area, does not interfere with subsequent processing steps, does not increase oxide thickness above a practical limit, and does not increase the turn-on voltage.

SUMMARY OF THE INVENTION

The structure of the invention prevents parasitic inversion layers from appearing along the substrate surface of an MOS FET device without reducing the available substrate surface area, and without increasing the thickness of the insulating layer thereon above a practical limit. Furthermore, the structure of the invention eliminates processing problems of prior art approaches, it eliminates the likelihood of contamination and subsequent undesirable drift, and it enables the turn-on voltage to remain at a low level. Thus, with the structure of the invention, complex arrays of MOS FET devices can be fabricated with higher density than heretofore possible, without the danger of parasitic inversion layers interfering with device operation.

Briefly, the structure of the invention comprises a substrate of semiconductor material of one conductivity type having a surface. Overlying portions of the surface is a layer of insulating protective material. Interconnection layers of conductive metal are located upon portions of the insulating layer. Embedded within a portion of the insulating layer and underlying but separated from the interconnection layers are layers of semiconductor material, each of which extends to make electrical connection to the substrate. Unwanted parasitic inversion layers produced by electrical fields and charges in, on, or about the interconnection layers are prevented by the embedded semiconductor layers from causing deterioration in the operation of the MOS FET device.

BRIEF DESCRIPTION OF THE DRAWING

FIG. 1 shows a simplified cross section of an MOS FET device, with the left-hand interconnection layer without an underlying embedded semiconductor layer causing an unwanted inversion path, whereas the right-hand interconnection layer with an underlying embedded semiconductor layer is prevented from creating an unwanted inversion path.

DESCRIPTION OF THE PREFERRED EMBODIMENT

Referring to FIG. 1, the structure comprises a substrate 10 of semiconductor material, such as silicon, and having an impurity concentration of one conductivity type, for example, N type. A layer of insulating protective material 11 is located over principal surface 12 of substrate 10. Suitably, layer 11 comprises an oxide, such as silicon dioxide, and is formed by thermal oxidation or vapor deposition. Portions of layer 11 are selectively removed during the processing steps in order to make electrical connections to, or diffuse impurities into, substrate 10.

A typical MOS FET structure comprises first and second regions 13 and 14, located in substrate 10 adjacent one another but spaced apart to form channel 20 therebetween. Regions 13 and 14 have an impurity concentration that is of a conductivity type opposite that of substrate 10, for example, P type. A PN junction 15 is located between substrate 10 and 13, and another PN junction 16 is located between substrate 10 and region 14. Each of PN junctions 15 and 16 has an edge at the principal surface 12. A protective insulating layer 21 is located over channel region 20 and over the adjacent edges of PN junctions 15 and 16. Insulating layer 21 can comprise an oxide, such as silicon dioxide formed by thermal oxidation or vapor deposition. Atop insulating material 21 is found an electrode 24, which comprises a conductive material, such as aluminum which can be formed by vacuum evaporation. When a potential of suitable polarity is applied to electrode 24, a conducting path is formed across channel region 20 between regions 13 and 14.

Metallic interconnection layers 26 and 28 are located atop portions of the protective overlayer and function to conduct signals between active regions of the device, and provide means for external connection. In FIG. 1, interconnection layers 26 and 28 extend to make ohmic contact to respective regions 13 and 14. Preferably, interconnection layers 26 and 28 have high conductance. Aluminum is particularly suitable for the topside interconnection layers 26 and 28, because aluminum can be easily placed (by vacuum evaporation) atop, and is adherent to, an insulating oxide layer, such as layer 11. When voltages and currents are applied to the interconnection layers of an MOS FET device, such as to interconnection layer 26, electric fields and charges tend to accumulate, in, around, and about insulating layer 11 and at the surface interface 12 between substrate 10 and layer 11. A large accumulation of charges, or a high potential level, in interconnection layer 26 produces unwanted parasitic inversion layers along the substrate surface 12. A row of plus signs 30 appear along surface 12 between regions 13 and 32 to indicate the presence of an unwanted inversion layer. Inversion layer 30 extends along surface 12 underneath, or near, interconnection layer 26 until contact is made to another region 32 of similar polarity, creating an unwanted conduction path so that device operation deteriorates, or even fails.

The structure of the invention prevents these unwanted conduction paths from occurring. A layer of semiconductor material 34 is embedded in the insulating layer 11 underneath the interconnection layer 28. Semiconductor layer 34 extends to substrate 10 and makes ohmic contact therewith so that the potential and polarity in embedded layer 34 are about the same as that of substrate 10. When a potential of one polarity is applied to interconnection layer 28, and a potential representing ground or an opposite polarity is applied to the conductive layer 34, the latter functions to prevent unwanted inversion layers from occurring along the underlying substrate surface 12 and portion 11B of layer 11 adjacent thereto. This protective function is indicated in FIG. 1 by not including a row of plus signs along surface 12 between regions 14 and 40 under embedded layer 34. A few plus signs 36 are included, however, along surface 12 not underlying nor protected by embedded layer 34. It can be clearly seen that but for embedded layer 34, an inversion layer would extend along surface 12 between regions 14 and 40, resulting in unwanted conductive path similar to that between regions 13 and 32. Thus, embedded layer 34 prevents unwanted inversion layers due to voltage and current in interconnection layer 28 from causing deterioration in device operation.

Layer 34 comprises semiconductor material, such as silicon, and preferably polycrystalline silicon, which is compatible with subsequent semiconductor processing steps, particularly when insulating layer 11 is an oxide. Silicon and silicon dioxide, for example, are compatible with respect to the type of etchant used. Also, both materials are able to withstand heat treatment at a relatively high temperature such as above 850° C., which often is needed to remove impurities such as sodium and hydrogen from the silicon dioxide and thereby prevent leakage current from increasing during the operating life of the device. Moreover, use of a semiconductor material for the embedded layer 34 facilitates placing a nitride passivation layer over the insulating layer 11. Nitride deposition occurs from about 780° to 1050° C. Other materials, such as metal, and in particular aluminum, have been found unsuitable for use as the embedded layer 34, because the metal is not compatible with subsequent processing steps. Aluminum melts at about 550° C., so that if it were used for the embedded layer 34, substantial harm to the operation of the device would occur.

In order to improve the degree of protection afforded by the embedded layer 34, dopant atoms of the same conductivity type as that of the substrate are deposited into embedded layer 34. Preferably, the impurity concentration therein is above $10^{17}$ dopant atoms per cubic centimeter.

MOS FET devices using the embedded semiconductor layer of the invention have been found to operate satisfactorily with potentials in the range of 40 volts in the interconnection layers without deterioration in operating performance, or shorts, occurring. On the other hand, the operation of similar MOS FET devices without the embedded semiconductor layer deteriorates rapidly, and shorts occur between active regions, when voltages in the range of 25 to 30 volts are applied to the interconnection layers. The structure of the invention provides therefore a substantial increase in the voltage handling capability of the interconnection layers without reducing any of the available surface area.

I claim:

1. A conductor-insulator-semiconductor field-effect transistor structure comprising a substrate of semiconductor material having a principal surface, a layer of insulating protective material overlying and adherent to a portion of the principal surface, and interconnection layers of conductive metal overlying and extending along portions of the insulating layer, the structure characterized in that:

a layer of polycrystalline semiconductor material embedded within the insulating layer underlying one of the interconnection layers, wherein the impurity concentration of the embedded layer is greater than $10^{17}$ dopant atoms per cubic centimeter with a portion of said embedded polycrystalline semiconductor layer extending downwardly through a portion of the insulating layer to the substrate surface and making ohmic electrical contact thereto, so that unwanted electrical fields and charges are prevented from appearing in, on, and about the substrate surface and insulating layer due to voltages and currents in the interconnection layers.

2. The structure recited in claim 1 wherein the substrate and embedded semiconductor layer comprise silicon, the insulating layer comprises oxide, and the interconnection layers comprise aluminum.